(12) United States Patent
Watanabe

(10) Patent No.: US 12,406,950 B2
(45) Date of Patent: Sep. 2, 2025

(54) SEMICONDUCTOR DEVICE

(71) Applicant: Kioxia Corporation, Tokyo (JP)

(72) Inventor: Shinya Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 545 days.

(21) Appl. No.: 17/651,312

(22) Filed: Feb. 16, 2022

(65) Prior Publication Data

US 2022/0375887 A1 Nov. 24, 2022

(30) Foreign Application Priority Data

May 21, 2021 (JP) ................................. 2021-086411

(51) Int. Cl.
*H01L 25/065* (2023.01)
*H01L 23/00* (2006.01)
*H01L 25/00* (2006.01)
*H01L 25/18* (2023.01)

(52) U.S. Cl.
CPC .............. *H01L 24/05* (2013.01); *H01L 24/08* (2013.01); *H01L 25/0657* (2013.01); *H01L 25/18* (2013.01); *H01L 25/50* (2013.01); *H01L 24/03* (2013.01); *H01L 24/06* (2013.01); *H01L 2224/03845* (2013.01); *H01L 2224/05087* (2013.01); *H01L 2224/05096* (2013.01); *H01L 2224/05098* (2013.01); *H01L 2224/05166* (2013.01); *H01L 2224/05186* (2013.01); *H01L 2224/05552* (2013.01); *H01L 2224/0557* (2013.01); *H01L 2224/05644* (2013.01); *H01L 2224/05647* (2013.01); *H01L 2224/05684* (2013.01); *H01L 2224/06181* (2013.01); *H01L 2224/08146* (2013.01); *H01L 2225/06544* (2013.01)

(58) Field of Classification Search
CPC ...... H01L 24/05; H01L 25/0657; H01L 24/08
See application file for complete search history.

(56) References Cited

U.S. PATENT DOCUMENTS

| 5,997,983 | A | 12/1999 | Caron et al. |
| 7,847,412 | B2 | 12/2010 | Trezza |
| 8,159,057 | B2 | 4/2012 | Okada et al. |
| 10,026,769 | B2 | 7/2018 | Kagawa et al. |

(Continued)

FOREIGN PATENT DOCUMENTS

| JP | H11-150114 A | 6/1999 |
| JP | 2002-501676 A | 1/2002 |

(Continued)

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

A semiconductor device according to the present embodiment includes a substrate having a first semiconductor circuit provided thereon. First pads are located on the substrate. A first insulating layer is located on an outer side of each of the first pads. Second pads are respectively bonded to the first pads. A second insulating layer is located on an outer side of each of the second pads and is bonded to the first insulating layer. The first pads each include a first conductive material, and a first insulating material located on an inner side of the first conductive material on a bonding surface of the first pads and the second pads.

18 Claims, 16 Drawing Sheets

(56) References Cited

U.S. PATENT DOCUMENTS

| | | | |
|---|---|---|---|
| 10,096,645 B2 | 10/2018 | Chen et al. | |
| 2004/0150112 A1* | 8/2004 | Oda | H01L 24/03 257/762 |
| 2006/0240623 A1* | 10/2006 | Lee | H10D 30/69 438/257 |
| 2011/0084574 A1 | 4/2011 | Weston | |
| 2015/0270304 A1* | 9/2015 | Saito | H01L 25/50 438/109 |
| 2016/0013099 A1* | 1/2016 | Tanida | H01L 24/08 438/107 |
| 2016/0111386 A1 | 4/2016 | England et al. | |
| 2016/0365497 A1 | 12/2016 | Kim et al. | |
| 2019/0148342 A1* | 5/2019 | Hu | H01L 25/105 257/659 |
| 2019/0279952 A1 | 9/2019 | Tagami | |
| 2021/0050330 A1 | 2/2021 | Leng et al. | |

FOREIGN PATENT DOCUMENTS

| | | |
|---|---|---|
| JP | 2008-544527 A | 12/2008 |
| JP | 2012-244101 A | 12/2012 |
| JP | 5401093 B2 | 1/2014 |
| JP | 2020-047814 A | 3/2020 |
| JP | 2020-102485 A | 7/2020 |
| JP | 2021-034560 A | 3/2021 |
| TW | I458057 B | 10/2014 |
| WO | WO 2015/050000 A1 | 4/2015 |
| WO | WO 2021/026865 A1 | 2/2021 |

* cited by examiner

SEMICONDUCTOR DEVICE

CROSS REFERENCE TO RELATED APPLICATIONS

This application is based upon and claims the benefit of priority from the prior Japanese Patent Application No. 2021-086411, filed on May 21, 2021, the entire contents of which are incorporated herein by reference.

FIELD

The embodiments of the present invention relate to a semiconductor device.

BACKGROUND

In recent years, a technology of sticking a plurality of semiconductor chips to electrically bond pads to each other is developed. Meanwhile, in a polishing method such as a CMP (Chemical Mechanical Polishing) method, dishing (a recess) sometimes occurs due to a difference in the quality of materials to be polished. If the pads on the bonding surface are recessed due to dishing, the contact resistance between the pads may be increased or an open circuit failure between the pads may occur when a plurality of semiconductor chips are stuck to each other.

DETAILED DESCRIPTION

Figure 1:
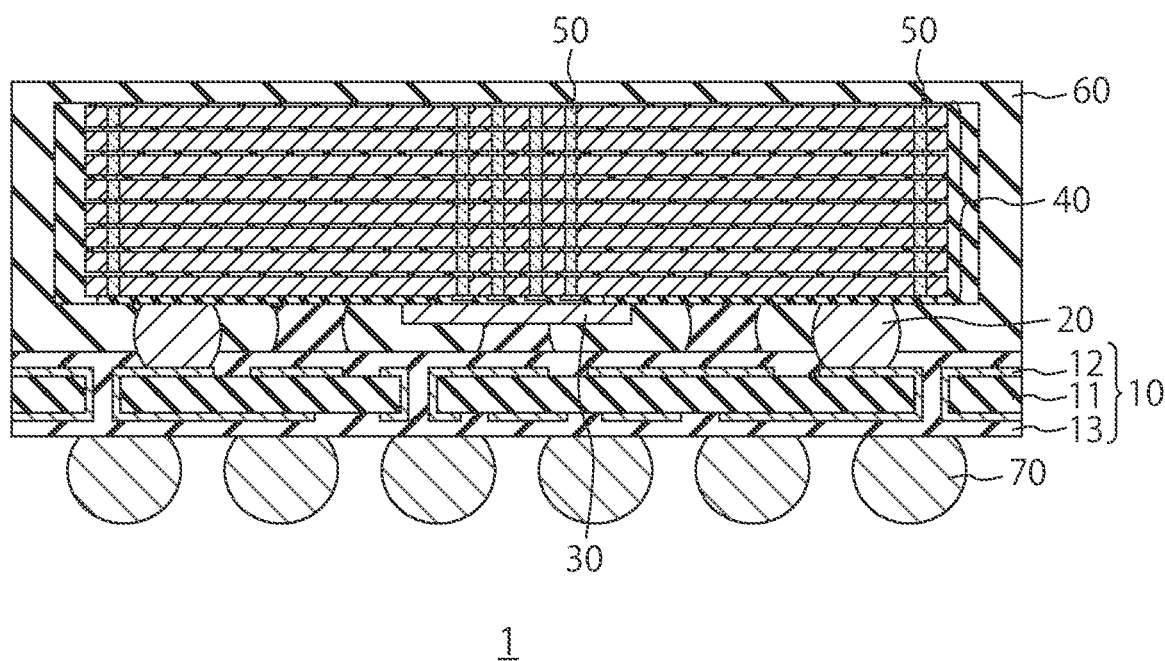
FIG. 1 is a sectional view illustrating a configuration example of a semiconductor package according to a first embodiment.

Embodiments will now be explained with reference to the accompanying drawings. The present invention is not limited to the embodiments. In the embodiments, the term "upper direction" or "lower direction" of a semiconductor chip occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a substrate having a first semiconductor circuit provided thereon. First pads are located on the substrate. A first insulating layer is located on an outer side of each of the first pads. Second pads are respectively bonded to the first pads. A second insulating layer is located on an outer side of each of the second pads and is bonded to the first insulating layer. The first pads each include a first conductive material, and a first insulating material located on an inner side of the first conductive material on a bonding surface of the first pads and the second pads.

First Embodiment

FIG. 1 is a sectional view illustrating a configuration example of a semiconductor package 1 according to a first embodiment. The semiconductor package 1 of the present embodiment is an example of a package of semiconductor memories. However, the present embodiment can also be applied to other semiconductor devices.

The semiconductor package 1 includes a wiring substrate 10, metallic bumps 20, solder balls 70, a controller chip 30, a memory chip stacked body 40 including a plurality of stacked memory chips, electrodes 50 provided to penetrate through the memory chips, and a sealing resin 60.

The wiring substrate 10 includes an insulator 11, a wiring layer 12, and a solder resist layer 13. For example, an insulating material such as glass epoxy resin is used as the insulator 11. The wiring layer 12 is a conductor provided on the front and back surfaces of the insulator 11. For example, a low-resistance metallic material such as copper is used as the wiring layer 12. The solder resist layer 13 is provided on the wiring layer 12.

The metallic bumps 20 are provided on the front surface side of the wiring substrate 10 and are electrically connected to portions of the wiring layer 12, respectively. The solder balls 70 are provided on the back surface side of the wiring substrate 10 and are electrically connected to portions of the wiring layer 12, respectively.

The controller chip 30 is provided above the front surface of the wiring substrate 10. The controller chip 30 is provided to control the memory chips.

The memory chip stacked body 40 is stacked on the controller chip 30. The memory chips are, for example, semiconductor chips on which NAND memory cells are mounted. The memory chips and the controller chip 30 are electrically connected via the electrodes 50. The electrodes 50 transmit supply power, a ground voltage, a control signal, data, or the like. For example, a conductive material such as tungsten, nickel, copper, gold, aluminum, or polysilicon is used as the electrodes 50.

The sealing resin 60 is provided on the front surface of the wiring substrate 10 and seals the controller chip 30 and the memory chip stacked body 40.

Figure 2:
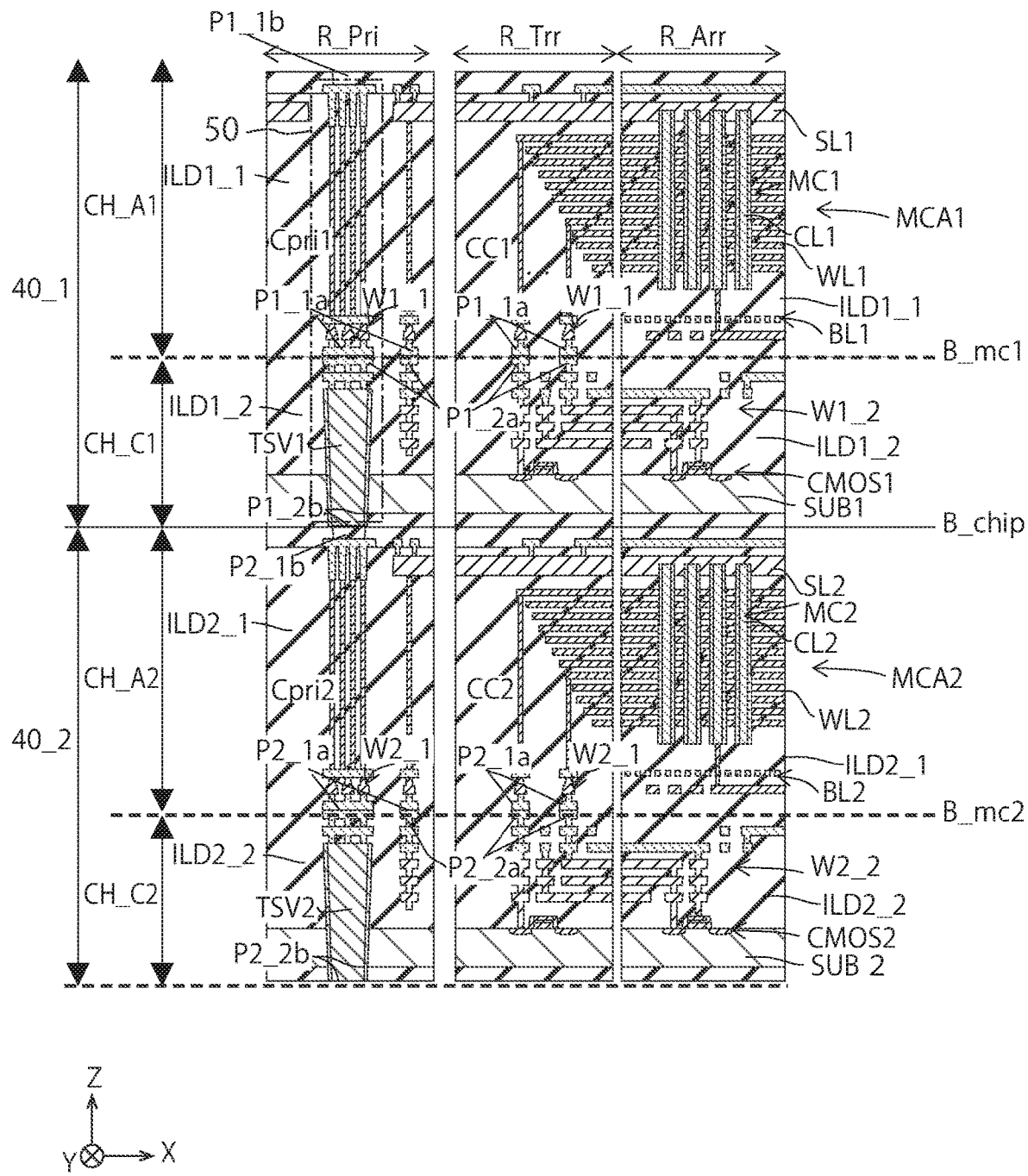
FIG. 2 is a sectional view illustrating a configuration example of a portion of the semiconductor package according to the first embodiment.

FIG. 2 is a sectional view illustrating a configuration example of a portion of the semiconductor package 1 according to the first embodiment. FIG. 2 illustrates a cross section of stacked two memory chips 40_1 and 40_2. The memory chip 40_1 and the memory chip 40_2 are bonded to each other on a bonding surface B_chip.

The memory chip 40_1 includes an array chip CH_A1 including a memory cell array MCA1, and a circuit chip CH_C1 including a CMOS (Complementary Metal Oxide Semiconductor) circuit CMOS1. The memory chip 40_2 includes an array chip CH_A2 including a memory cell array MCA2, and a circuit chip CH_C2 including a CMOS circuit CMOS2. In the memory chip 40_1, one of the memory cell array MCA1 and the CMOS circuit CMOS1 may be a first semiconductor circuit and the other thereof may be a second semiconductor circuit. In the memory chip 40_2, one of the memory cell array MCA2 and the CMOS circuit CMOS2 may be a first semiconductor circuit and the other thereof may be a second semiconductor circuit. The memory cell array MCA1 and the CMOS circuit CMOS1 included in the memory chip 40_1 may be a first semiconductor circuit and the memory cell array MCA2 and the CMOS circuit CMOS2 included in the memory chip 40_2 may be a second semiconductor circuit with the bonding surface B_chip interposed therebetween.

Memory Chip 40_1

The array chip CH_A1 includes the memory cell array MCA1 covered with an interlayer dielectric film ILD1_1. The memory cell array MCA1 includes a plurality of word lines WL1 stacked in a Z direction and insulated from each other, and a plurality of columnar bodies CL1 extending to penetrate through the stacked word lines WL1 in the stacking direction (the Z direction). Memory cells MC1 are provided to correspond to intersections between the word lines WL1 and the columnar bodies CL1, respectively. One ends of the columnar bodies CL1 are connected in common to a source line SL1. The other ends of the columnar bodies CL1 are connected to any of bit lines BL1 extending in a Y direction, respectively.

The memory cell array MCA1 is provided in an array region R_Arr. The word lines WL1 extend in an X direction to a terrace region R_Trr and are formed in the manner of stairs in the terrace region R_Trr. A contact plug CC1 is connected to a step surface of each of the word lines WL1 formed in the stair manner. Each of the contact plugs CC1 is electrically connected between an associated one of pads P1_1a provided in the terrace region R_Trr and the associated word line WL1 via a wiring layer W1_1. The pads P1_1a are electrode pads exposed on a surface of the interlayer dielectric film ILD1_1 and provided on a bonding surface B_mc1 of the array chip CH_A1. The wiring layer W1_1 electrically connects between the memory cell array MCA1 and the pads P1_1a via the contact plugs CC1, respectively.

A peripheral region R_Pri is provided around the array region R_Arr and the terrace region R_Trr. The peripheral region R_Pri may be provided at various locations including a central portion of the memory chips as well as the peripheral portion of the memory chips. Contact plugs Cpri1 are provided in the peripheral region R_Pri to penetrate through the interlayer dielectric film ILD1_1 of the array chip CH_A1 in the Z direction. One ends of the contact plugs Cpri1 are electrically connected to the pads P1_1a provided on the bonding surface B_mc1 in the peripheral region R_Pri via the wiring layer W1_1, respectively. The other ends of the contact plugs Cpri1 are electrically connected to pads P1_1b provided on the opposite surface to the bonding surface B_mc1 of the array chip CH_A1, respectively.

The circuit chip CH_C1 is provided below (in a −Z direction) the array chip CH_A1 and includes the CMOS circuit CMOS1 covered with an interlayer dielectric film ILD1_2. The CMOS circuit CMOS1 is a circuit provided on a semiconductor layer SUB1 and including a P-type MOSFET (MOS Field Effect Transistor) and an N-type MOSFET. The CMOS circuit CMOS1 may include other semiconductor elements (for example, a resistive element or a capacitive element). The CMOS circuit CMOS1 is covered with the interlayer dielectric film ILD1_2. A multilayer wiring layer W1_2 is provided in the interlayer dielectric film ILD1_2. The multilayer wiring layer W1_2 electrically connects between the CMOS circuit CMOS1 and pads P1_2a. The pads P1_2a are electrode pads exposed on a surface of the interlayer dielectric film ILD1_2 and provided on the bonding surface B_mc1 of the circuit chip CH_C1. The pads P1_2a may be provided in any of the array region R_Arr, the terrace region R_Trr, and the peripheral region R_Pri.

Through silicon vias TSV1 are provided in the peripheral region R_Pri of the circuit chip CH_C1. The through silicon vias TSV1 are portions of the electrodes 50, respectively. The through silicon vias TSV1 penetrate through the semiconductor layer SUB1 in the Z direction and are electrically connected between associated ones of the pads P1_2a and associated ones of pads P1_2b, respectively. The pads P1_2b are electrode pads provided at end portions of the through silicon vias TSV1 on the opposite side to the bonding surface B_mc1, respectively.

The array chip CH_A1 and the circuit chip CH_C1 are stuck to each other on the bonding surface B_mc1. The interlayer dielectric films ILD1_1 and ILD1_2 are bonded and the pads P1_1a and P1_2a are bonded, respectively, on the bonding surface B_mc1. This enables the CMOS circuit CMOS1 of the circuit chip CH_C1 to be electrically connected to the memory cell array MCA1 via the multilayer wiring layer W1_2, the pads P1_2a and P1_1a, and the contact plugs CC1. As a result, the CMOS circuit CMOS1 can control the memory cell array MCA1. The through silicon vias TSV1 are electrically connected to the contact plugs Cpri1 via the pads P1_2a and P1_1a and the wiring layer W1_1. The through silicon vias TSV1 are provided, for example, to enable the supply power or the ground potential to be transmitted to chips in common.

Memory Chip 40_2

The array chip CH_A2 includes the memory cell array MCA2 covered with an interlayer dielectric film ILD2_1. The memory cell array MCA2 includes a plurality of word lines WL2 stacked in the Z direction and insulated from each other, and a plurality of columnar bodies CL2 extending to penetrate through the stacked word lines WL2 in the stacking direction (the Z direction). Memory cells MC2 are provided to correspond to intersections between the word lines WL2 and the columnar bodies CL2, respectively. One ends of the columnar bodies CL2 are connected in common to a source line SL2. The other ends of the columnar bodies CL2 are connected to any of bit lines BL2 extending in the Y direction, respectively.

The memory cell array MCA2 is provided in the array region R_Arr. The word lines WL2 extend in the X direction to the terrace region R_Trr and are formed in the manner of stairs in the terrace region R_Trr. A contact plug CC2 is connected to a step surface of each of the word lines WL2 formed in the stair manner. Each of the contact plugs CC2 is electrically connected between an associated one of pads P2_1a provided in the terrace region R_Trr and the associated word line WL2 via a wiring layer W2_1. The pads P2_1a are electrode pads exposed on a surface of the interlayer dielectric film ILD2_1 and provided on a bonding surface B_mc2 of the array chip CH_A2. The wiring layer W2_1 electrically connects between the memory cell array MCA2 and the pads P2_1a via the contact plugs CC2, respectively.

The peripheral region R_Pri is provided around the array region R_Arr and the terrace region R_Trr. Contact plugs Cpri2 are provided in the peripheral region R_Pri to penetrate through the interlayer dielectric film ILD2_1 of the array chip CH_A2 in the Z direction. One ends of the contact plugs Cpri2 are electrically connected to the pads P2_1a provided on the bonding surface B_mc2 in the peripheral region R_Pri via the wiring layer W2_1, respectively. The other ends of the contact plugs Cpri2 are electrically connected to pads P2_1b provided on the opposite surface to the bonding surface B_mc2 of the array chip CH_A2, respectively.

The circuit chip CH_C2 is provided below (in the −Z direction) the array chip CH_A2 and includes the CMOS circuit CMOS2 covered with an interlayer dielectric film ILD2_2. The CMOS circuit CMOS2 is a circuit provided on a semiconductor layer SUB2 and including a P-type MOSFET and an N-type MOSFET. The CMOS circuit CMOS2 may include other semiconductor elements (for example, a resistive element or a capacitive element). The CMOS circuit CMOS2 is covered with the interlayer dielectric film ILD2_2. A multilayer wiring layer W2_2 is provided in the interlayer dielectric film ILD2_2. The multilayer wiring layer W2_2 electrically connects between the CMOS circuit CMOS2 and pads P2_2a. The pads P2_2a are electrode pads exposed on a surface of the interlayer dielectric film ILD2_2 and provided on the bonding surface B_mc2 of the circuit chip CH_C2. The pads P2_2a may be provided in any of the array region R_Arr, the terrace region R_Trr, and the peripheral region R_Pri.

Through silicon vias TSV2 are provided in the peripheral region R_Pri of the circuit chip CH_C2. The through silicon vias TSV2 penetrate through the semiconductor layer SUB2 in the Z direction and are electrically connected between associated ones of the pads P2_2a and associated one of pads P2_2b, respectively. The pads P2_2b are electrode pads provided at end portions of the through silicon vias TSV2 on the opposite side to the bonding surface B_mc2, respectively.

The array chip CH_A2 and the circuit chip CH_C2 are stuck to each other on the bonding surface B_mc2. The interlayer dielectric films ILD2_1 and ILD2_2 are bonded and the pads P2_1a and P2_2a are bonded, respectively, on the bonding surface B_mc2. This enables the CMOS circuit CMOS2 of the circuit chip CH_C2 to be electrically connected to the memory cell array MCA2 via the multilayer wiring layer W2_2, the pads P2_2a and P2_1a, and the contact plugs CC2. As a result, the CMOS circuit CMOS2 can control the memory cell array MCA2. The through silicon vias TSV2 are electrically connected to the contact plugs Cpri2 via the pads P2_2a and P2_1a and the wiring layer W2_1. The through silicon vias TSV2 are also provided, for example, to enable the supply power or the ground potential to be transmitted to chips in common.

Bonding Between Memory Chips 40_1 And 40_2

The memory chip 40_1 and the memory chip 40_2 are bonded to each other on the bonding surface B_chip. The pads P1_2b and the pads P2_1b are respectively bonded to each other on the bonding surface B_chip. The memory chips 40_1 and 40_2 are electrically connected via the pads P1_2b and P2_1b bonded to each other. Accordingly, the through silicon vias TSV1 and TSV2 and the contact plugs Cpri1 and Cpri2 are electrically connected and can transmit, for example, the supply power or the ground potential to the stacked memory chips 40_1 and 40_2 in common.

Configuration Of Pads P1_1a And The Like

Figure 3A:
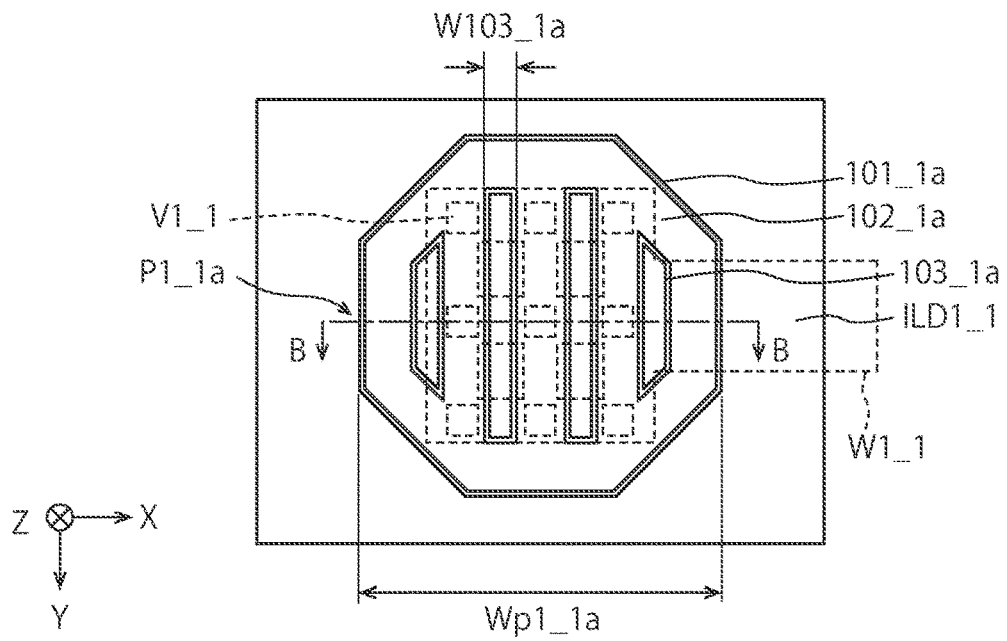
FIG. 3A is a plan view illustrating a configuration example of pads.

FIG. 3A is a plan view illustrating a configuration example of the pads P1_1a. In FIG. 3A, the pads P1_1a are exposed from the surface of the interlayer dielectric film ILD1_1 in a first planar view from a direction substantially perpendicular to the surface (the bonding surface B_mc1) of the interlayer dielectric film ILD1_1 of the array chip CH_A1 (a planar view seen from the Z direction). In the above planar view, each of the pads P1_1a is surrounded by the interlayer dielectric film ILD1_1 and has, for example, a substantially octagonal shape. The planar shape of each of the pads P1_1a may be a shape of a polygon other than the octagon, a substantially circular shape, or a substantially elliptical shape.

A barrier metal film 101_1a, a conductive material 102_1a, and an insulating material 103_1a are provided on the inner side of each of the pads P1_1a.

The barrier metal film 101_1a is provided at the outer edge of each of the pads P1_1a and is located between the interlayer dielectric film ILD1_1 or the insulating material 103_1a and the conductive material 102_1a. For example, a conductive material such as a stacked film including a titanium film and a titanium nitride film is used as the barrier metal film 101_1a.

The conductive material 102_1a is provided on the inner side of each of the pads P1_1a surrounded by the barrier metal film 101_1a. For example, a conductive material such as copper or tungsten is used as the conductive material 102_1a. The insulating material 103_1a is provided in the manner of islands on the inner side of the conductive material 102_1a and is surrounded by the conductive material 102_1a.

In the above planar view, a plurality of the insulating materials 103_1a extend in the Y direction and each have an elongated shape on a surface of the conductive material 102_1a. In the above planar view, the insulating materials 103_1a are arrayed in the X direction orthogonal to the Y direction in the manner of stripes or the manner of lines and spaces on the surface of the conductive material 102_1a. In other words, the insulating materials 103_1a are provided in the manner of slits or strips extending substantially in parallel to each other. The insulating materials 103_1a are provided on the inner side of each of the pads P1_1a and do not reach the barrier metal film 101_1a and the interlayer dielectric film ILD1_1 in the above planar view. The insulating materials 103_1a may connect to the interlayer dielectric film ILD1_1 below the pads P1_1a. The same material (for example, a silicon dioxide film) as that of the interlayer dielectric film ILD1_1 can be used as the insulating materials 103_1a.

In the above planar view, the area of the insulating materials 103_1a in each of the pads P1_1a is smaller than the area of the conductive material 102_1a. By setting the area of the conductive material 102_1a to be relatively large, the contact area with the conductive material 102_2a in the pads P1_2a of the circuit chip CH_C1 becomes larger and the contact resistance between each of the pads P1_1a and the associated one of the pads P1_2a can be suppressed to be low.

The insulating materials 103_1a are formed of a material lower in the etching rate in the CMP process than the material (for example, a metallic material such as copper or tungsten) of the conductive material 102_1a (for example, an oxide film such as a silicon dioxide film, a nitride film such as a silicon nitride film, a carbide film such as a silicon carbide film, or a composite material thereof can be used as the insulating materials 103_1a). For example, the insulating materials 103_1a can be formed of a material physically harder and less likely to be polished than the material of the conductive material 102_1a. Alternatively, the insulating materials 103_1a may be formed of a material less likely to be chemically etched by an abrasive (slurry) than the material of the conductive material 102_1a. Therefore, in the CMP process, the insulating materials 103_1a serve as supporting posts on the inner side of the conductive material 102_1a and can reduce thinning of the film thickness at a central portion of the conductive material 102_1a and reduce production of a recess (dishing).

A width Wp1_1a in the X direction or the Y direction of each of the pads P1_1a is, for example, about 1 micrometer (μm). A width W103_1a of each of the insulating materials 103_1a is, for example, about several tens of nanometers.

The wiring layer W1_1 indicated by a broken line is provided below each of the pads P1_1a. The wiring layer W1_1 is electrically connected to the associated pad P1_1a through via contacts V1_1. In the present embodiment, nine via contacts V1_1 are provided between each of the pads P1_1a and the associated wiring layer W1_1. However, the number of the via contacts V1_1 is not limited to nine and can be any value. FIG. 3C is a plan view illustrating one example of the configuration of the wiring layer W1_1. The wiring layer W1_1 is formed in the shape of a cross within a substantially square frame below the associated pad P1_1a in the planar view described above. The nine via contacts V1_1 are provided on the wiring layer W1_1. The wiring layer W1_1 may have a solid shape instead of the cross shape.

Figure 3B:
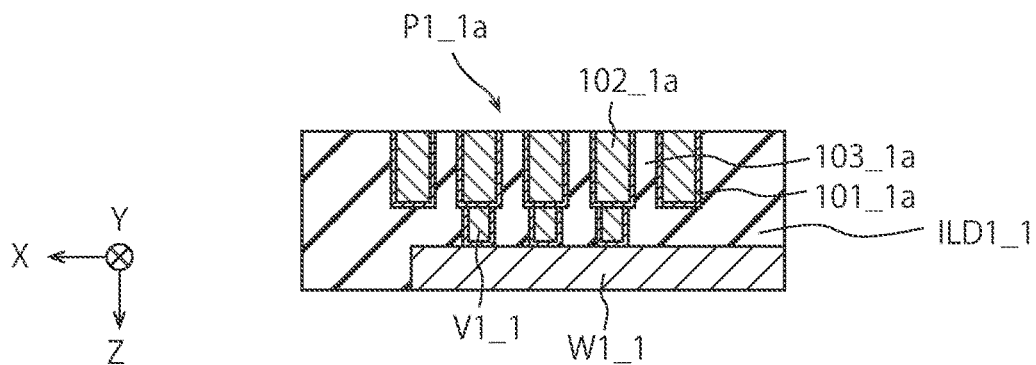
FIG. 3B is a sectional view illustrating a configuration example of the pads.
Figure 3C:
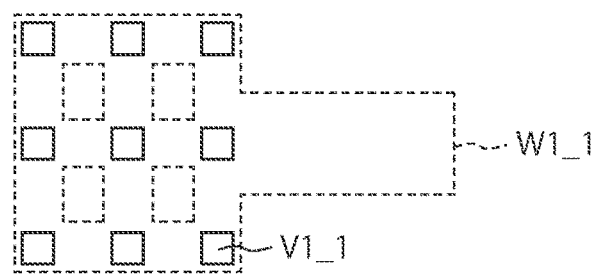
FIG. 3C is a plan view illustrating one example of a configuration of a wiring layer.

FIG. 3B is a sectional view illustrating a configuration example of the pads P1_1. FIG. 3B illustrates a cross section along a line B-B in FIG. 3A. The pads P1_1a are embedded in the interlayer dielectric film ILD1_1 and are exposed on the surface of the interlayer dielectric film ILD1_1. The conductive material 102_1a is electrically connected to the associated wiring layer W1_1 provided therebelow through the via contacts V1_1.

The insulating materials 103_1a can be parts of the interlayer dielectric film ILD1_1 and can be of the same material. The height of the conductive material 102_1a is, for example, about 1 μm.

As described above, according to the present embodiment, each of the pads P1_1a includes the insulating materials 103_1a provided in the manner of islands on the inner side of the conductive material 102_1a in the planar view from the direction substantially perpendicular to the bonding surface B_mc1. The insulating materials 103_1a are formed of a material lower in the etching rate than the conductive material 102_1a.

Therefore, in the CMP process to polish the interlayer dielectric film ILD1_1 and the conductive material 102_1a, the insulating materials 103_1a serve as supporting posts within the conductive material 102_1a and can reduce dishing of the conductive material 102_1a.

If the insulating materials 103_1a are not provided, the conductive material 102_1a is polished in a relatively wide area. In this case, the inner side of the conductive material 102_1a is greatly dished and recessed.

In contrast thereto, according to the present embodiment, the insulating materials 103_1a divide the conductive material 102_1a into relatively small areas and serve as supporting posts within the conductive material 102_1a. Accordingly, dishing is suppressed on the inner side of the conductive material 102_1a.

It is preferable that the insulating materials 103_1a are arranged substantially uniformly in the conductive material 102_1a. This can suppress dishing of the conductive material 102_1a from occurring locally greatly.

While the pads P1_1a have been explained with reference to FIGS. 3A and 3B, the pads P1_2a, P2_1a, P2_2a, P1_2b, and P2_1b can be similarly configured. Therefore, dishing is suppressed in the CMP process also in pads P1_2a, P2_1a, P2_2a, P1_2b, and P2_1b other than the pads P1_1a. Since the configurations of the pads P1_2a, P2_1a, P2_2a, P1_2b, and P2_1b can be easily understood with reference to FIGS. 3A and 3B, detailed explanations thereof are omitted.

Figure 4:
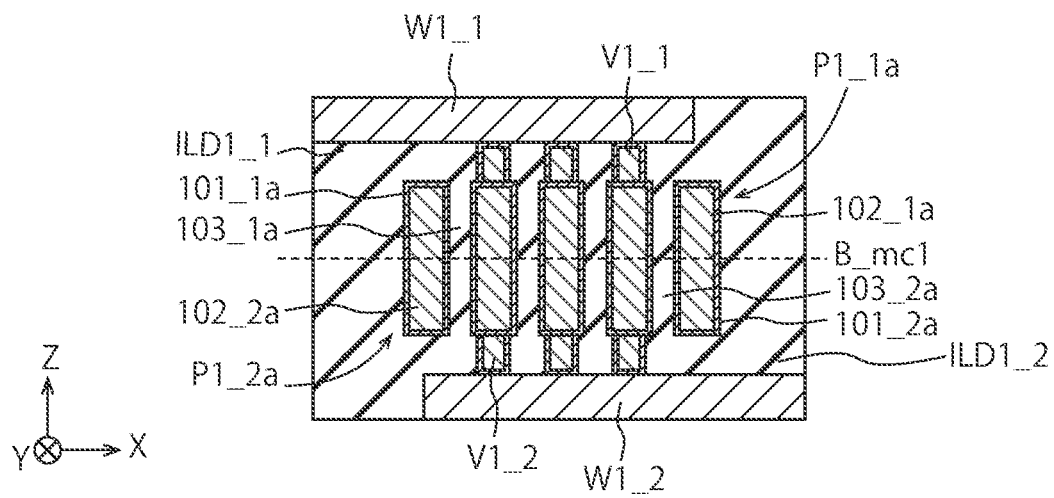
FIG. 4 is a sectional view illustrating a configuration example of a portion of a bonding surface.

FIG. 4 is a sectional view illustrating a configuration example of a portion of the bonding surface B_mc1. The pads P1_1a on the side of the array chip CH_A1 and the pads P1_2a on the side of the circuit chip CH_C1 are respectively bonded to each other on the bonding surface B_mc1.

The pads P1_1a and the pads P1_2a both have the configuration illustrated in FIGS. 3A and 3B. Therefore, similarly to the pads P1_1a illustrated in FIG. 3A, the barrier metal film 101_2a, the conductive material 102_2a, and the insulating material 103_2a are provided on the inner side of each of the pads P1_2a in a planar view from a direction substantially perpendicular to the surface of the interlayer dielectric film ILD1_2.

The pads P1_1a, the interlayer dielectric film ILD1_1, the barrier metal film 101_1a, the conductive material 102_1a, and the insulating material 103_1a in FIGS. 3A and 3B are respectively read as the pads P1_2a, the interlayer dielectric film ILD1_2, the barrier metal film 101_2a, the conductive material 102_2a, and the insulating material 103_2a in the following explanations of the pads P1_2a.

The barrier metal film 101_2a is provided at the outer edge of each of the pads P1_2a and is located between the interlayer dielectric film ILD1_2 or the insulating material 103_2a and the conductive material 102_2a. For example, a conductive material such as a stacked film including a titanium film and a titanium nitride film is used as the barrier metal film 101_2a.

The conductive material 102_2a is provided on the inner side of each of the pads P1_2a surrounded by the barrier metal film 101_2a. For example, a conductive material such as copper or tungsten is used as the conductive material 102_2a. The insulating material 103_2a is provided in the manner of islands on the inner side of the conductive material 102_2a and is surrounded by the conductive material 102_2a.

In the planar view described above, a plurality of the insulating materials 103_2a extend in the Y direction and each have an elongated shape on a surface of the conductive material 102_2a. In the above planar view, the insulating materials 103_2a are arrayed in the X direction orthogonal to the Y direction in the manner of stripes or the manner of lines and spaces on the surface of the conductive material 102_2a. In other words, the insulating materials 103_2a are provided in the manner of slits or strips extending substantially in parallel to each other. The insulating materials 103_1a are provided on the inner side of each of the pads P1_2a and do not reach the barrier metal film 101_2a and the interlayer dielectric film ILD1_2 in the above planar view. The same material (for example, a silicon dioxide film) as that of the interlayer dielectric film ILD1_2 can be used as the insulating materials 103_2a.

The insulating materials 103_2a are formed of a material (for example, a silicon dioxide film) lower in the etching rate than the material (for example, a metallic material such as copper or tungsten) of the conductive material 102_2a. For example, the insulating materials 103_2a may be formed of a material physically harder and less likely to be polished than the material of the conductive material 102_2a. Alternatively, the insulating materials 103_2a may be formed of a material less likely to be chemically etched by an abrasive (slurry) than the material of the conductive material 102_2a. Therefore, in the CMP process, the insulating materials 103_2a serve as supporting posts on the inner side of the conductive material 102_2a and can reduce dishing of the conductive material 102_2a.

A width Wp1_2a in the X direction or the Y direction of each of the pads P1_2a is, for example, about 1 μm. A width W103_2a of each of the insulating materials 103_2a is, for example, about several tens of nanometers.

The pads P1_2a are embedded in the interlayer dielectric film ILD1_2 and are exposed on the surface of the interlayer dielectric film ILD1_2. The conductive material 102_2a is electrically connected to the associated wiring layer W1_2 provided therebelow. The insulating materials 103_2a can be parts of the interlayer dielectric film ILD1_2 and can be of the same material. The height of the conductive material 102_2a is, for example, about 1 μm.

As described above, the pads P1_1a and P1_2a have substantially same configurations. Each of the pads P1_1a and the associated pad P1_2a are bonded to each other on the bonding surface B_mc1 between the pads P1_1a and the pads P1_2a in such a manner that the extending direction of the insulating materials 103_1a and the extending direction of the insulating materials 103_2a are substantially same directions (for example, the Y direction). Accordingly, the conductive material 102_1a and the conductive material 102_2a are bonded to substantially face each other and match each other on the bonding surface B_mc1 as illustrated in FIG. 4 when the array chip CH_A1 is stuck to the circuit chip CH_C1. At that time, the pads P1_1a and the pads P1_2a are little dished and the conductive materials 102_1a and 102_2a are little recessed on the bonding surface B_mc1. That is, the conductive material 102_1a and 102_2a are provided to be substantially flush on the bonding surface B_mc1. Therefore, the conductive material 102_1a and the conductive material 102_2a can be bonded on the bonding surface B_mc1 with a sufficiently low resistance while the insulating materials 103_1a and 103_2a are provided on the inner side of the conductive material 102_1a and the conductive material 102_2a, respectively.

If the insulating materials 103_1 and 103_2 are not provided, the conductive materials 102_1a and 102_2a are likely to be poorly bonded due to dishing in the CMP process while the areas of the conductive materials 102_1a and 102_2a on the bonding surface B_mc1 are correspondingly increased. Therefore, there is a risk that the contact resistance between the conductive material 102_1a and the conductive material 102_2a is increased.

In contrast thereto, according to the present embodiment, the insulating materials 103_1a and 103_2a are provided and therefore the areas of the conductive materials 102_1a and 102_2a on the bonding surface B_mc1 are correspondingly decreased. However, dishing of the conductive materials 102_1a and 102_2a are suppressed and the conductive materials 102_1a and 102_2a are little recessed on the bonding surface B_mc1. Therefore, the contact resistance between the conductive material 102_1a and the conductive material 102_2a can be lowered and stabilized.

A manufacturing method of the pads P1_1a and P1_2a according to the first embodiment is explained next.

FIGS. 5 to 11 are sectional views illustrating one example of the manufacturing method of the pads P1_1a according to the first embodiment. Since the manufacturing method of the pads P1_2a is same as that of the pads P1_1a, detailed explanations thereof are omitted.

First, the memory cell array MCA1, the interlayer dielectric film ILD1_1, and the like are formed on a substrate (for example, a silicon substrate) for the array chip CH_A1. Next, the wiring layer W1_1 is formed in the interlayer dielectric film ILD1_1 of the array chip CH_A1.

Figure 5:
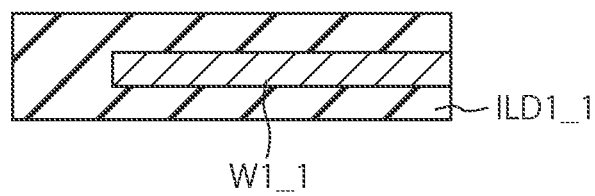
FIG. 5 is a sectional view illustrating one example of a manufacturing method of the pads according to the first embodiment.

Next, an insulating film is further deposited on the wiring layer W1_1 and the interlayer dielectric film ILD1_1. The insulating film can be of the same material (for example, a silicon dioxide film) as that of the interlayer dielectric film ILD1_1. Therefore, the insulating film on the wiring layer W1_1 is also referred to as the interlayer dielectric film ILD1_1. The structure illustrated in FIG. 5 is thereby obtained.

Figure 6:
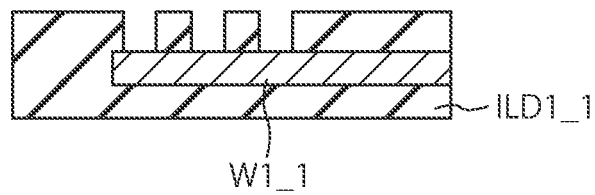
FIG. 6 is a sectional view illustrating one example of the manufacturing method of the pads in continuation from FIG. 5.

Next, the interlayer dielectric film ILD1_1 on the wiring layer W1_1 is processed using a lithography technique and an etching technique. Accordingly, the interlayer dielectric film ILD1_1 on the wiring layer W1_1 is processed into a pattern of the via contacts V1_1 as illustrated in FIG. 6.

Figure 7:
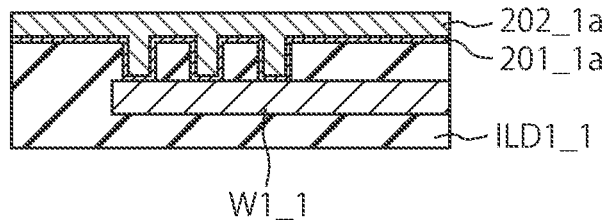
FIG. 7 is a sectional view illustrating one example of the manufacturing method of the pads in continuation from FIG. 6.

Subsequently, a barrier metal film 201_1a and a conductive material 202_1a are deposited on the interlayer dielectric film ILD1_1 and the wiring layer W1_1 as illustrated in FIG. 7. For example, a stacked film including a titanium film and a titanium nitride film is used as the barrier metal film 201_1a. For example, a conductive material such as copper or tungsten is used as the conductive material 202_1a.

Figure 8:
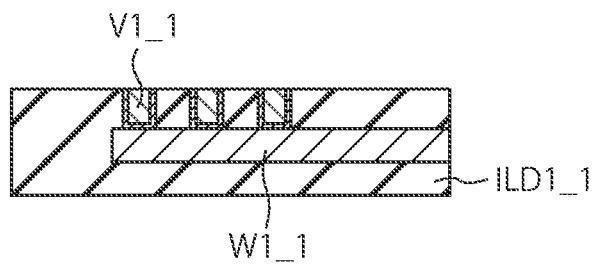
FIG. 8 is a sectional view illustrating one example of the manufacturing method of the pads in continuation from FIG. 7.

Next, the barrier metal film 201_1a and the conductive material 202_1a are polished using the CMP method until the interlayer dielectric film ILD1_1 is exposed. The via contacts V1_1 each including the barrier metal film 201_1a and the conductive material 202_1a are thereby formed as illustrated in FIG. 8.

Figure 9:
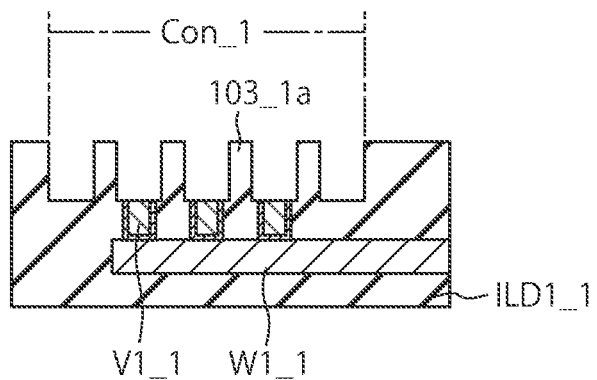
FIG. 9 is a sectional view illustrating one example of the manufacturing method of the pads in continuation from FIG. 8.

Next, an insulating film is further deposited on the via contacts V1_1. The insulating film can be of the same material (for example, a silicon dioxide film) as that of the interlayer dielectric film ILD1_1. Therefore, the insulating film on the via contacts V1_1 is also referred to as the interlayer dielectric film ILD1_1. Subsequently, the interlayer dielectric film ILD1_1 on the via contacts V1_1 is processed into a pattern of the pads P1_1a using a lithography technique and an etching technique as illustrated in FIG. 9. A first concave portion Con_1 may be formed on each of the pads P1_1a, a first insulating layer may be formed around the first concave portion Con_1, and a first insulating material may be formed on the inner side of the first concave portion Con_1.

Figure 10:
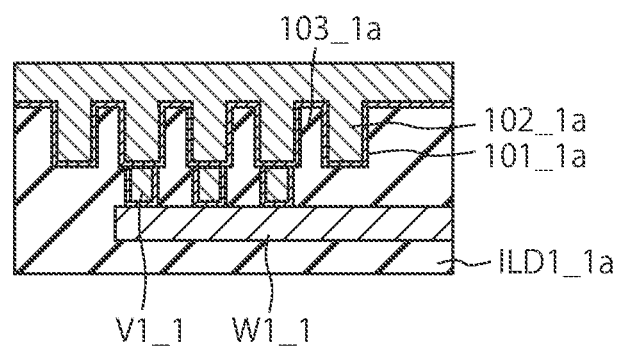
FIG. 10 is a sectional view illustrating one example of the manufacturing method of the pads in continuation from FIG. 9.

Next, the barrier metal film 101_1a and the conductive material 102_1a are deposited on the interlayer dielectric film ILD1_1 and the via contacts V1_1 as illustrated in FIG. 10. For example, a stacked film including a titanium film and a titanium nitride film is used as the barrier metal film 101_1a. For example, a conductive material such as copper or tungsten is used as the conductive material 102_1a.

Figure 11:
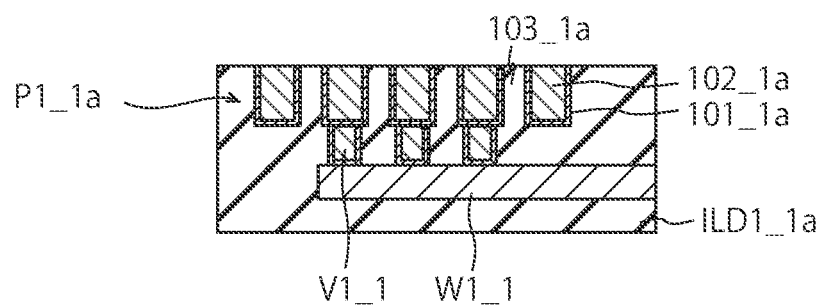
FIG. 11 is a sectional view illustrating one example of the manufacturing method of the pads in continuation from FIG. 10.

Subsequently, the barrier metal film 101_1a and the conductive material 102_1a are polished using the CMP method until the interlayer dielectric film ILD1_1 is exposed. Accordingly, the pads P1_1a each including the barrier metal film 101_1a and the conductive material 102_1a are formed as illustrated in FIG. 11. The interlayer dielectric film ILD1_1 exposed in the CMP process becomes the insulating materials 103_1a described above.

The insulating materials 103_1a are provided on the inner side of the conductive material 102_1a in the manner of islands (for example, the manner of stripes or the manner of lines and spaces) as illustrated in FIG. 3A. The insulating materials 103_1a function as supporting posts in the conductive material 102_1a in the CMP process for the barrier metal film 101_1a and the conductive material 102_1a. Accordingly, dishing (a recess) of the conductive material 102_1a in the pads P1_1a is suppressed.

The manufacturing method of the pads P1_1a of the array chip CH_A1 has been explained above. The pads P1_2a of the circuit chip CH_C1 are formed in the same manner as that of the pads P1_1a while being connected to the CMOS circuit CMOS1. Therefore, dishing (a recess) of the conductive material 102_2a is suppressed also in the pads P1_2a.

Dishing of the pads P1_1a of the array chip CH_A1 and the pads P1_2a of the circuit chip CH_C1 is suppressed. Therefore, when the array chip CH_A1 is stuck to the circuit chip CH_C1, the pads P1_1a and the pads P1_2a are sufficiently bonded to each other with almost no space therebetween as illustrated in FIG. 4. As a result, an increase in the contact resistance of the pads between the array chip CH_A1 and the circuit chip CH_C1 can be suppressed to suppress an open circuit failure.

While the bonding between the array chip CH_A1 and the circuit chip CH_C1 has been explained above, the present embodiment can be applied also to bonding between the memory chips 40_1 and 40_2.

Bonding Between Memory Chips 40_1 And 40_2

As illustrated in FIG. 2, the memory chip 40_1 and the memory chip 40_2 are bonded to each other on the bonding surface B_chip. The memory chip 40_1 and 40_2 have a same configuration.

Each of the pads P1_2b of the memory chip 40_1 and the associated one of the pads P2_1b of the memory chip 40_2 are electrically connected to each other on the bonding surface B_chip. Each of the pads P1_2b is electrically connected to the associated one of the through silicon vias TSV1 provided in the circuit chip CH_C1 of the memory chip 40_1 via a redistribution layer (not illustrated). Each of the pads P2_1b is electrically connected to the associated one of the contact plugs Cpri2 of the array chip CH_A2 of the memory chip 40_2.

The pads P1_2b and P2_1b can have the same configuration as that of the pads P1_1a illustrated in FIGS. 3A and 3B. Accordingly, each of the pads P1_2b and the associated one of the pads P2_1b are bonded in the same manner as the pads P1_1a and the pads P1_2a illustrated in FIG. 4. Therefore, the effects of the present embodiment can be achieved also in the bonding between the memory chips 40_1 and 40_2.

FIGS. 12 to 17 are sectional views illustrating one example of a formation process of a region of the through silicon vias TSV1 of the circuit chip CH_C1.

Figure 12:
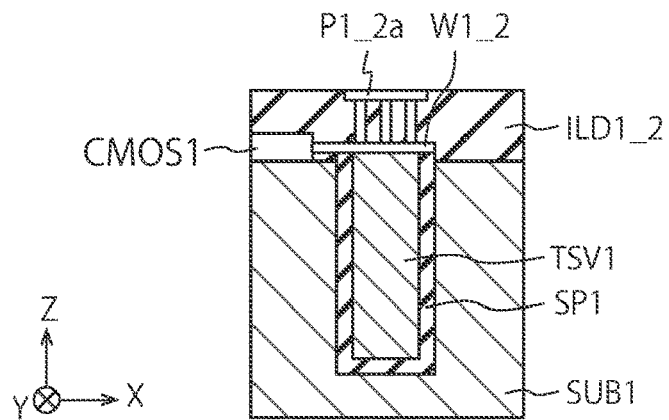
FIG. 12 is a sectional view illustrating one example of a formation process of a region of through silicon vias of a circuit chip.

First, the CMOS circuit CMOS1 is formed on a substrate (for example, a silicon substrate) SUB1 using a semiconductor manufacturing process. As illustrated in FIG. 12, the CMOS circuit CMOS1 is electrically connected to the through silicon vias TSV1 via the pads P1_2a and the wiring layer W1_2 (or receiving electrodes for the through silicon vias), respectively. Illustrations of the CMOS circuit CMOS1, the pads P1_2a, and the wiring layer W1_2 are omitted in FIG. 13 and subsequent drawings.

Next, holes are formed in the formation region of the through silicon vias TSV1 using a lithography technique and an etching technique. A spacer dielectric film SP1 is formed on the inner walls of the holes. Next, the material (for example, copper or tungsten) of the through silicon vias TSV1 is embedded inside the spacer dielectric film (for example, a silicon dioxide film) SP1 using a plating method or the like. Subsequently, the interlayer dielectric film ILD1_2 is deposited on the substrate SUB1. The structure illustrated in FIG. 12 is thereby obtained.

In this way, the through silicon vias TSV1 are formed after the CMOS circuit is formed. Therefore, the through silicon vias TSV1 are formed after high-temperature heat treatment of the CMOS circuit, which enables the material (for example, copper or tungsten) of the through silicon vias TSV1 to be formed using the plating method. Ends of the through silicon vias TSV1 on the side of the CMOS circuit can be electrically connected to the CMOS circuit or may be electrically connected to an external electrode.

Next, the circuit chip CH_C1 is stuck to the array chip CH_A1. At that time, the pads P1_1a and the pads P1_2a are respectively bonded to each other (see FIG. 2).

Figure 13:
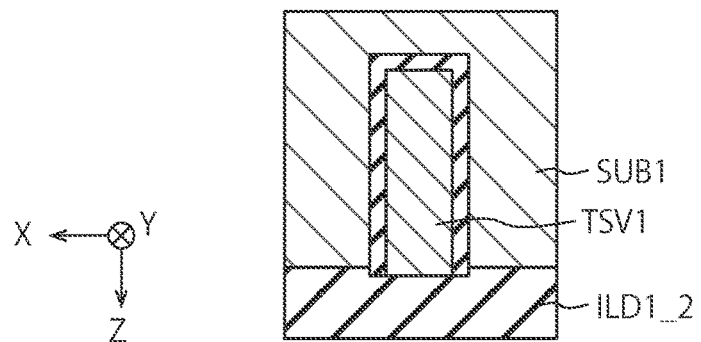
FIG. 13 is a sectional view illustrating one example of the manufacturing method of the pads in continuation from FIG. 12.
Figure 14:
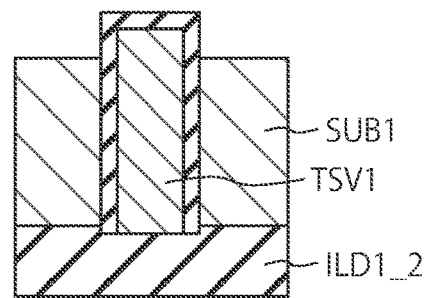
FIG. 14 is a sectional view illustrating one example of the manufacturing method of the pads in continuation from FIG. 13.

Next, the substrate SUB1 is turned upside down as illustrated in FIG. 13. Subsequently, the back side of the substrate SUB1 is etched to expose ends of the through silicon vias TSV1 and the spacer dielectric film SP1 as illustrated in FIG. 14.

Figure 15:
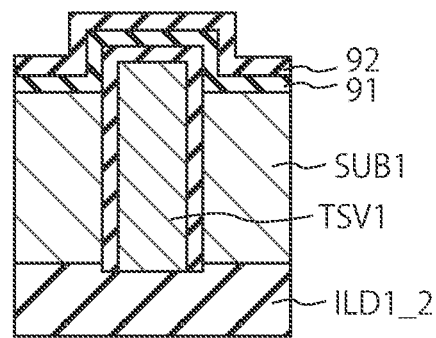
FIG. 15 is a sectional view illustrating one example of the manufacturing method of the pads in continuation from FIG. 14.

Next, insulating films 91 and 92 are deposited on the substrate SUB1 and the through silicon vias TSV1 as illustrated in FIG. 15. The insulating film 91 is, for example, a silicon nitride film and the insulating film 92 is, for example, a silicon dioxide film.

Figure 16:
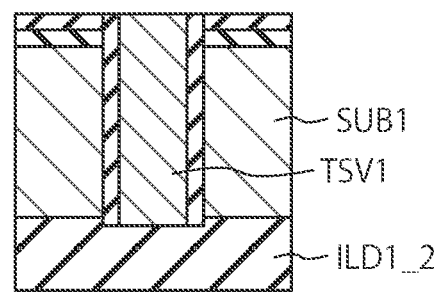
FIG. 16 is a sectional view illustrating one example of the manufacturing method of the pads in continuation from FIG. 15.

Next, the insulating films 91 and 92 are polished using the CMP method until the through silicon vias TSV1 are exposed as illustrated in FIG. 16. The through silicon vias TSV1 are thereby formed in the substrate SUB1. The through silicon vias TSV1 penetrate through the substrate SUB1 in a state of being electrically insulated from the substrate SUB1 by the spacer dielectric film SP1.

Figure 17:
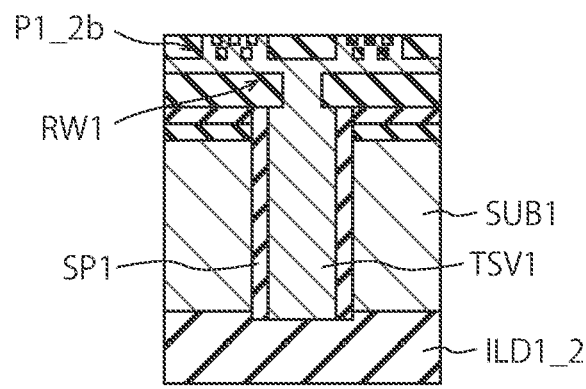
FIG. 17 is a sectional view illustrating one example of the manufacturing method of the pads in continuation from FIG. 16.

Next, a redistribution layer RW1 is formed as illustrated in FIG. 17. Next, the pads P1_2b are formed on the redistribution layer RW1. The configuration and formation method of the pads P1_2b are as explained with reference to FIGS. 3A to 11.

Subsequently, the memory chips 40_1 and 40_2 are stuck to each other. The pads P1_2b and the associated pads P2_1b are thereby respectively stuck to each other as illustrated in FIG. 2.

In a case in which through silicon vias are provided in the array chip CH_A1, the through silicon vias in the array chip CH_A1 can also be formed by the same method as illustrated in FIGS. 12 to 17.

First Modification

FIGS. 18A to 18D are sectional views illustrating another example of the manufacturing method of the pads P1_1a. Since the manufacturing method of the pads P1_2a is same as that of the pads P1_1a, detailed explanations thereof are omitted.

Figure 18A:
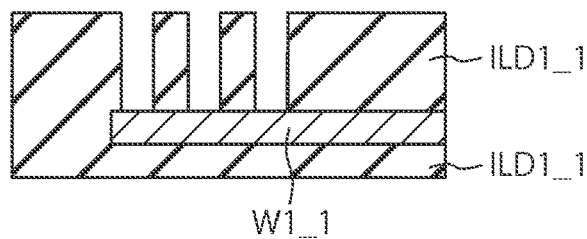
FIG. 18A is a sectional view illustrating another example of the manufacturing method of the pads.

After the structure illustrated in FIG. 5 is formed, the interlayer dielectric film ILD1_1 on the wiring layer W1_1 is processed using a lithography technique and an etching technique. Accordingly, the interlayer dielectric film ILD1_1 on the wiring layer W1_1 is processed into the pattern of the via contacts V1_1 as illustrated in FIG. 18A.

Figure 18B:
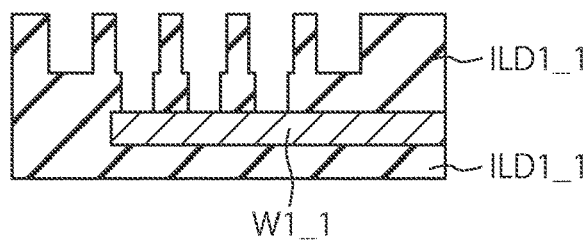
FIG. 18B is a sectional view illustrating the manufacturing method of the pads in continuation from FIG. 18A.

Next, the interlayer dielectric film ILD1_1 is processed again using the lithography technique and the etching technique to process an upper portion of the interlayer dielectric film ILD1_1 into the pattern of the pads P1_1a as illustrated in FIG. 18B. Accordingly, the pattern of the pads P1_1a is formed in the upper portion of the interlayer dielectric film ILD1_1 and the pattern of the via contacts V1_1 is formed under the pattern of the pads P1_1a to be continuous therewith.

Figure 18C:
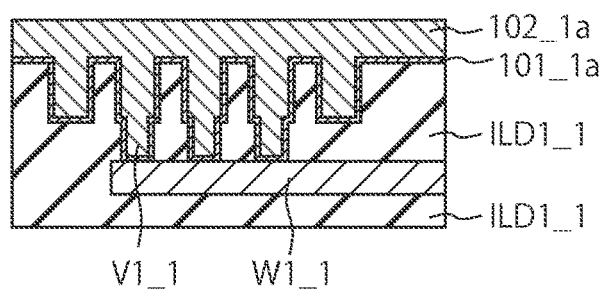
FIG. 18C is a sectional view illustrating the manufacturing method of the pads in continuation from FIG. 18B.

Subsequently, the barrier metal film 101_1a and the conductive material 102_1a are deposited on the interlayer dielectric film ILD1_1 and the wiring layer W1_1 as illustrated in FIG. 18C.

Figure 18D:
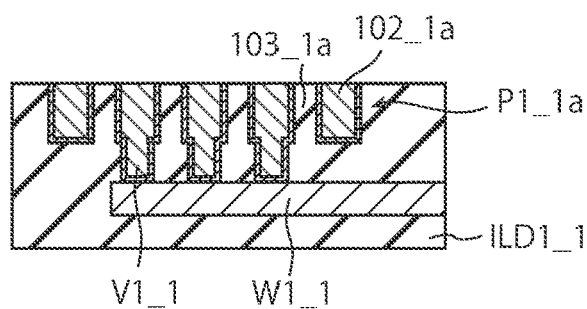
FIG. 18D is a sectional view illustrating the manufacturing method of the pads in continuation from FIG. 18C.

Next, the barrier metal film 101_1a and the conductive material 102_1a are polished using the CMP method until the interlayer dielectric film ILD1_1 is exposed. Accordingly, the via contacts V1_1 and the pads P1_1a each including the barrier metal film 101_1a and the conductive material 102_1a are simultaneously formed as illustrated in FIG. 18D.

In this CMP process, the insulating materials 103_1a serve as supporting posts on the inner side of the conductive material 102_1a and can reduce dishing of the conductive material 102_1a.

The via contacts V1_1 and the pads P1_1a are simultaneously formed in the first modification. Therefore, in the first modification, the pads P1_1a can be formed in fewer processes than those in the first embodiment. The rest of the manufacturing process in the first modification can be same as that in the first embodiment. Accordingly, the first modification can achieve the effects identical to those of the first embodiment.

Second Modification

FIGS. 19A to 19G are sectional views illustrating still another example of the manufacturing method of the pads P1_1a. Since the manufacturing method of the pads P1_2a is same as that of the pads P1_1a, detailed explanations thereof are omitted.

Figure 19A:
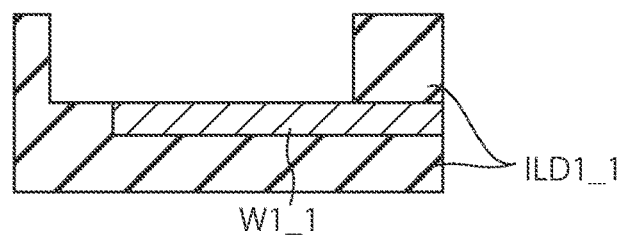
FIG. 19A is a sectional view illustrating still another example of the manufacturing method of the pads.

After the structure illustrated in FIG. 5 is formed, the interlayer dielectric film ILD1_1 in the entire formation region of each of the pads P1_1a in the interlayer dielectric film ILD1_1 on the wiring layer W1_1 is removed using a lithography technique and an etching technique. The structure illustrated in FIG. 19A is thereby obtained.

Figure 19B:
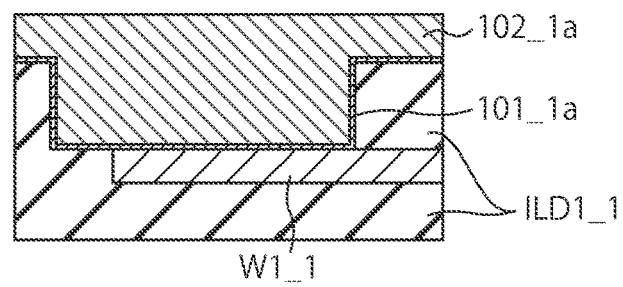
FIG. 19B is a sectional view illustrating the manufacturing method of the pads in continuation from FIG. 19A.

Next, the barrier metal film 101_1a and the conductive material 102_1a are deposited on the interlayer dielectric film ILD1_1 and the wiring layer W1_1 as illustrated in FIG. 19B.

Figure 19C:
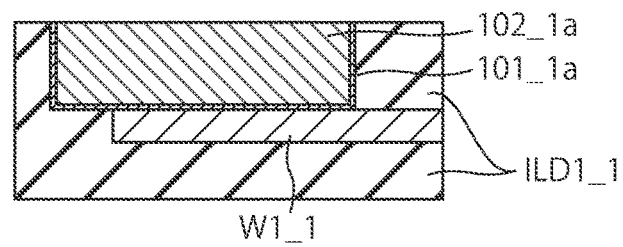
FIG. 19C is a sectional view illustrating the manufacturing method of the pads in continuation from FIG. 19B.

Next, the barrier metal film 101_1a and the conductive material 102_1a are polished using the CMP method until the interlayer dielectric film ILD1_1 is exposed. The barrier metal film 101_1a and the conductive material 102_1a are thereby formed in the entire formation region of each of the pads P1_1a as illustrated in FIG. 19C.

Figure 19D:
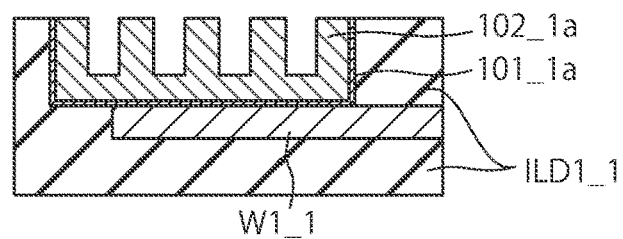
FIG. 19D is a sectional view illustrating the manufacturing method of the pads in continuation from FIG. 19C.

Subsequently, an upper portion of the conductive material 102_1a is processed using a lithography technique and an etching technique to remove the conductive material 102_1a located in the formation region of the insulating materials 103_1a. The structure illustrated in FIG. 19D is thereby obtained.

Figure 19E:
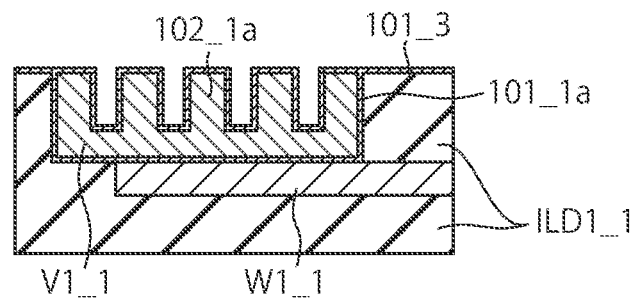
FIG. 19E is a sectional view illustrating the manufacturing method of the pads in continuation from FIG. 19D.

Next, a barrier metal film 101_3 is deposited on the interlayer dielectric film ILD1_1 and the conductive material 102_1a as illustrated in FIG. 19E.

Figure 19F:
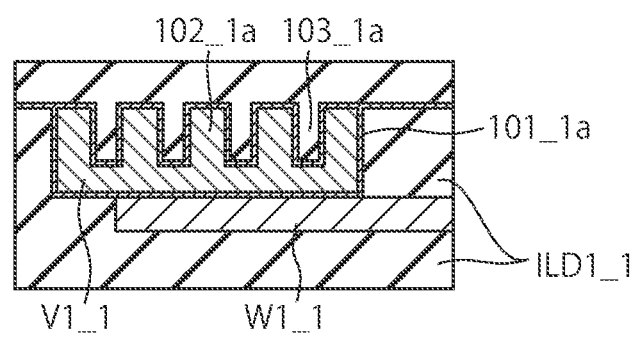
FIG. 19F is a sectional view illustrating the manufacturing method of the pads in continuation from FIG. 19E.

Next, the insulating material 103_1a is deposited on the barrier metal film 101_3 as illustrated in FIG. 19F.

Figure 19G:
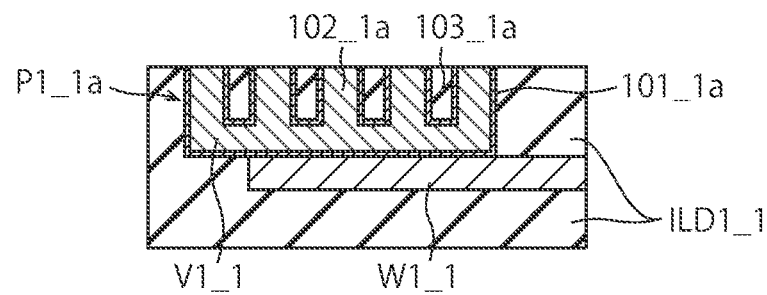
FIG. 19G is a sectional view illustrating the manufacturing method of the pads in continuation from FIG. 19F.

Next, the insulating material 103_1a is polished using the CMP method until the interlayer dielectric film ILD1_1 is exposed. The pads P1_1a are thereby formed as illustrated in FIG. 19G. Even when the conductive material 102_1a is exposed in this CMP process, the insulating materials 103_1a serve as supporting posts on the inner side of the conductive material 102_1a and dishing of the conductive material 102_1a can be reduced.

In the second modification, the via contacts V1_1 are formed in the entire formation region of each of the pads P1_1a. In this case, the pads P1_1a are connected to the wiring layer W1_1 through the via contacts V1_1.

Also in the second modification, the via contacts V1_1 and the pads P1_1a are simultaneously formed. Therefore, the pads P1_1a can be formed in fewer processes in the second modification than in the first embodiment. The rest of the formation process of the second modification can be same as that in the first embodiment. Accordingly, the second modification can achieve the effects identical to those of the first embodiment. An embodiment of using the pads P1_1a formed in the second modification will be described later with reference to FIG. 25.

Third Modification

FIGS. 20A to 20F are sectional views illustrating another example of the formation process of the region of the through silicon vias TSV1 of the circuit chip CH_C1. In this modification, the through silicon vias TSV1 are formed after the CMOS circuit is formed and the substrate SUB1 is inverted.

Figure 20A:
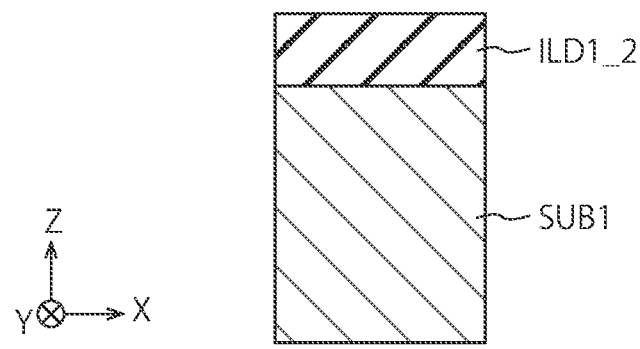
FIG. 20A is a sectional view illustrating another example of the formation process of the region of the through silicon vias of the circuit chip.

First, the CMOS circuit (not illustrated) is formed on the substrate SUB1 and the interlayer dielectric film ILD1_2 is deposited thereon. The structure illustrated in FIG. 20A is thereby obtained.

Figure 20B:
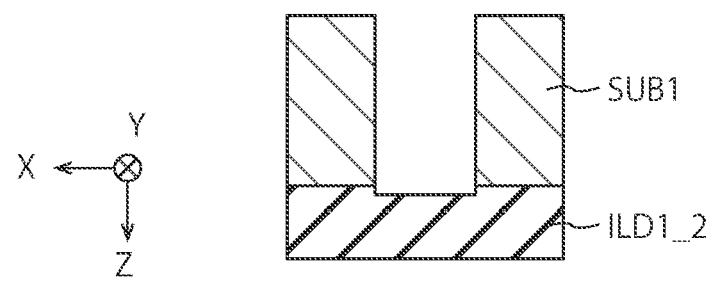
FIG. 20B is a sectional view illustrating another example of the formation process of the region of the through silicon vias in continuation from FIG. 20A.

Next, holes are formed in the formation region of the through silicon vias TSV1 using a lithography technique and an etching technique as illustrated in FIG. 20B.

Figure 20C:
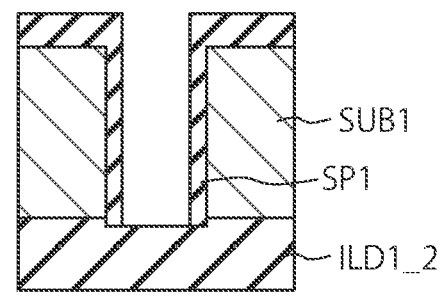
FIG. 20C is a sectional view illustrating another example of the formation process of the region of the through silicon vias in continuation from FIG. 20B.

Subsequently, as illustrated in FIG. 20C, the spacer dielectric film SP1 is formed on the inner wall of the holes and is etched back to remove the spacer dielectric film SP1 on bottom portions of the holes.

Figure 20D:
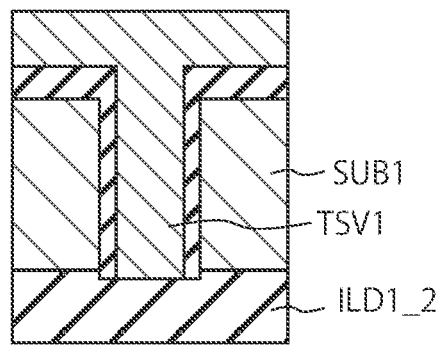
FIG. 20D is a sectional view illustrating another example of the formation process of the region of the through silicon vias in continuation from FIG. 20C.

Next, the material of the through silicon vias TSV1 is embedded on the inner side of the spacer dielectric film SP1 using a plating method or the like as illustrated in FIG. 20D.

In this way, the through silicon vias TSV1 are formed after formation of the CMOS circuit. Accordingly, the through silicon vias TSV1 are formed after high-temperature heat treatment of the CMOS circuit and therefore the material (for example, copper or tungsten) of the through silicon vias TSV1 can be formed into a film using the plating method.

Figure 20E:
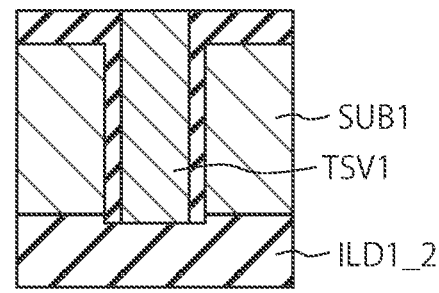
FIG. 20E is a sectional view illustrating another example of the formation process of the region of the through silicon vias in continuation from FIG. 20D.

Next, the material of the through silicon vias TSV1 is polished using the CMP method until the surface of the spacer dielectric film SP1 is exposed. The through silicon vias TSV1 are thereby formed in the substrate SUB1 as illustrated in FIG. 20E. The through silicon vias TSV1 penetrate through the substrate SUB1 in a state of being electrically insulated from the substrate SUB1 by the spacer dielectric film SP1.

Figure 20F:
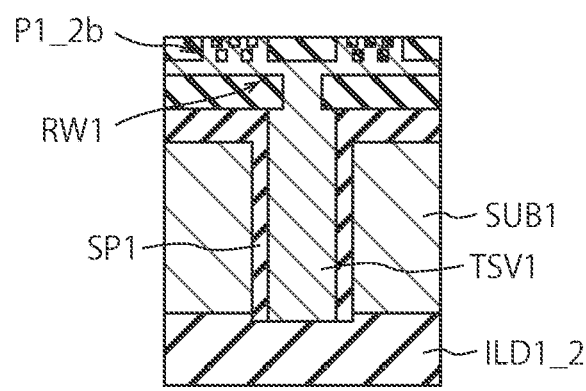
FIG. 20F is a sectional view illustrating another example of the formation process of the region of the through silicon vias in continuation from FIG. 20E.

Next, the redistribution layer RW1 is formed as illustrated in FIG. 20F. Subsequently, the pads P1_2b are formed on the redistribution layer RW1. The configuration and formation method of the pads P1_2b are as explained with reference to FIGS. 3A to 11.

Next, the memory chips 40_1 and 40_2 are stuck to each other. Accordingly, the pads P1_2b and the associated pads P2_1b are respectively stuck to each other as illustrated in FIG. 2.

In a case in which through silicon vias are provided in the array chip CH_A1, the through silicon vias in the array chip CH_A1 can also be formed in the same manner as that in the present modification.

Second Embodiment

Figure 21:
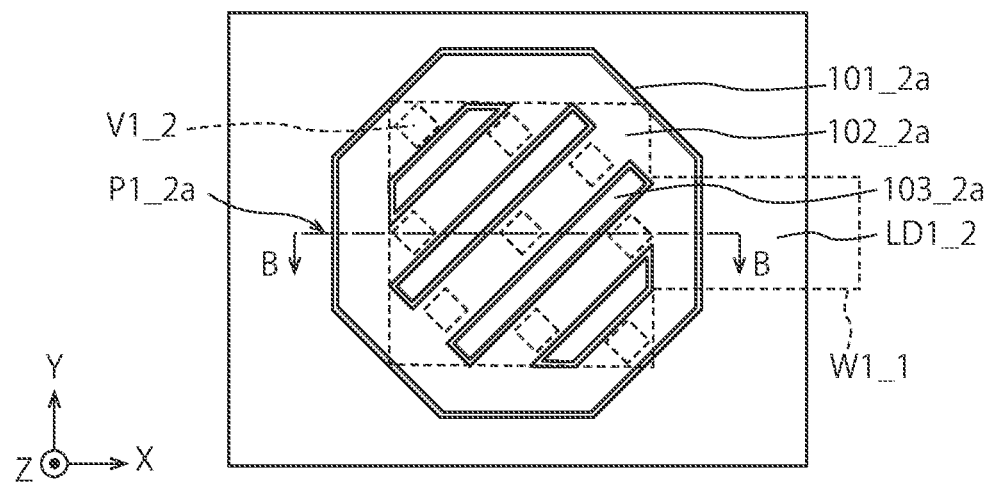
FIG. 21 is a plan view illustrating a configuration example of pads according to a second embodiment.

FIG. 21 is a plan view illustrating a configuration example of the pads P1_2a according to a second embodiment. In a case in which the pads P1_1a and the pads P1_2a have the same configuration as in the first embodiment, there is a possibility that the conductive material 102_1a faces the insulating materials 103_2a and the conductive material 102_2a faces the insulating materials 103_1a if the pads P1_1a are relatively displaced from the associated pads P1_2a in the X direction in FIG. 4, respectively. In this case, there is a risk that the contact area between the conductive material 102_1a and the conductive material 102_2a becomes extremely small, which increases and destabilizes the contact resistance between the pads P1_1a and the pads P1_2a.

In contrast thereto, the insulating materials 103_2a of the pads P1_2a extend in a direction oblique to the X and Y directions in a planar view seen from the Z direction in the second embodiment. The configurations of the pads P1_1a may be identical to those of the first embodiment.

Figure 22:
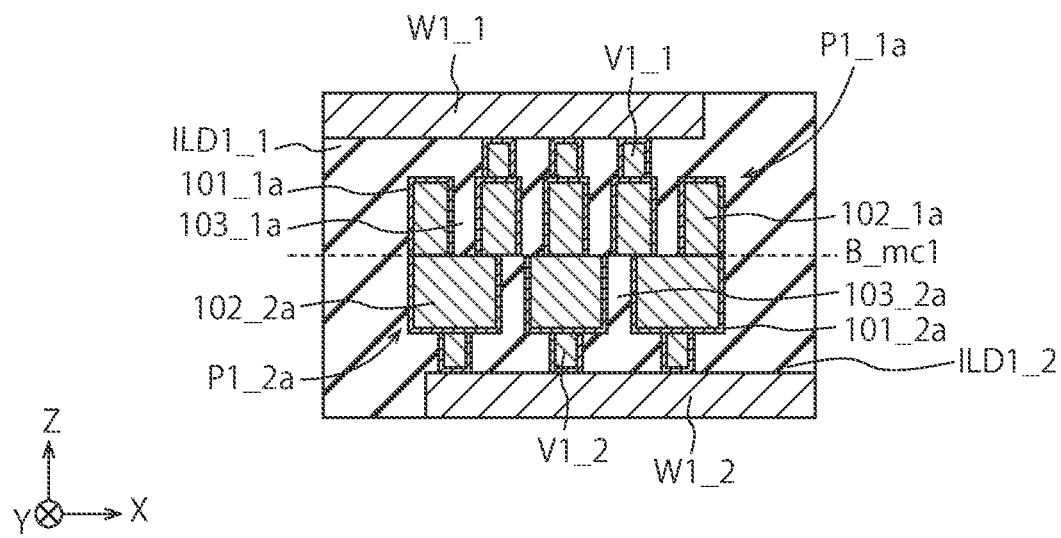
FIG. 22 is a sectional view illustrating a configuration example of a region of a bonding surface according to the second embodiment.

FIG. 22 is a sectional view illustrating a configuration example of a region of the bonding surface B_mc1 according to the second embodiment. In the second embodiment, the pads P1_1a and the pads P1_2a are respectively bonded to each other in such a manner that the extending direction (for example, the Y direction) of the insulating materials 103_1a intersects with the extending direction (a direction oblique to the X and Y directions) of the insulating materials 103_2a on the bonding surface B_mc1 when the array chip CH_A1 and the circuit chip CH_C1 are stuck to each other. A cross section along a line B-B in FIG. 21 is illustrated as the pad P1_2a in FIG. 22.

As viewed from a direction perpendicular to the substrate, the insulating materials 103_1a separate from each other partially overlap with the conductive material 102_2a, and the insulating materials 103_2a separate from each other partially overlap with the conductive material 102_1a. Since the extending direction of the insulating materials 103_1a intersects with the extending direction of the insulating materials 103_2a, the contact area between the conductive material 102_1a and the conductive material 102_2a does not reduce so much even if the pads P1_1a are displaced from the pads P1_2a to some extent in the X or Y direction. Therefore, the second embodiment enables the contact resistance to be low and stable against the displacement between the pads P1_1a and the pads P1_2a on the bonding surface B_mc1.

Third Embodiment

Figure 23:
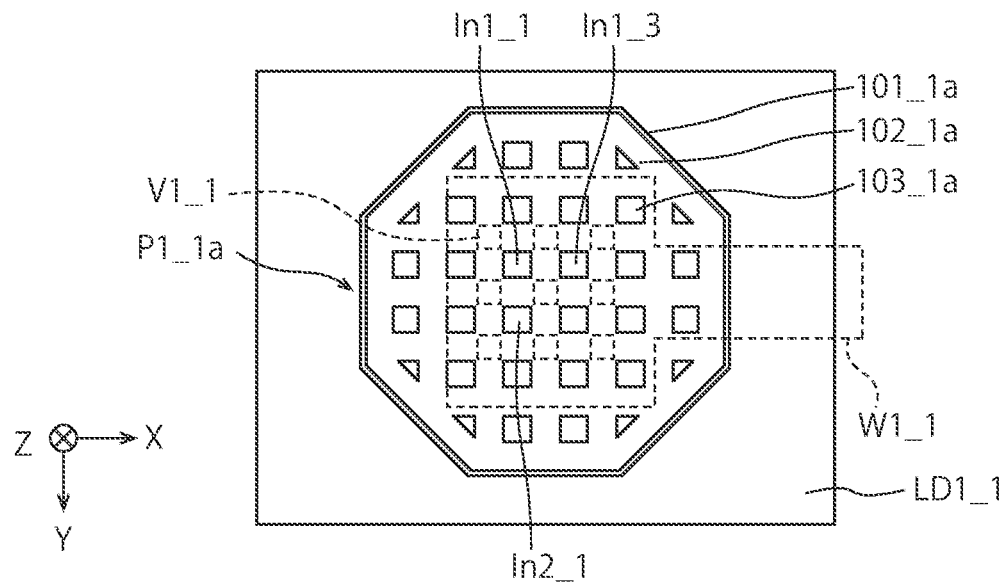
FIG. 23 is a plan view illustrating a configuration example of pads according to a third embodiment.

FIG. 23 is a plan view illustrating a configuration example of the pads P1_1a according to a third embodiment. In the third embodiment, the conductive material 102_1a of each of the pads P1_1a has a mesh structure including elongated shapes extending in the X direction and elongated shapes extending in the Y direction on the surface of the interlayer dielectric film ILD1_1 in a planar view seen from the Z direction. Therefore, the insulating materials 103_1a are formed in the manner of islands (the manner of dots) and are arrayed two-dimensionally in a matrix in the X direction and the Y direction on the surface of the interlayer dielectric film ILD1_1 in the planar view seen from the Z direction.

Assuming one of the insulating materials 103_1a as a first insulating portion In1_1, an insulating portion arranged in the Y direction and closest to the first insulating portion In1_1 is a second insulating portion In2_1 and an insulating portion arranged in the X direction and closest to the first insulating portion In1_1 is a third insulating portion In3_1.

The insulating materials 103_1a are formed of a material (for example, a silicon dioxide film) lower in the etching rate than the material (for example, a metallic material such as copper or tungsten) of the conductive material 102_1a. For example, the insulating materials 103_1a can be formed of a material physically harder and less likely to be polished than the material of the conductive material 102_1a. Alternatively, the insulating materials 103_1a may be formed of a material less likely to be chemically etched by an abrasive (slurry) than the material of the conductive material 102_1a. Therefore, in the CMP process, the insulating materials 103_1a serve as supporting posts on the inner side of the conductive material 102_1a and can reduce dishing of the conductive material 102_1a.

The pads P1_2a also have the same configuration as that of the pads P1_1a in FIG. 23. Accordingly, the conductive material 102_2a of each of the pads P1_2a also has a mesh structure including elongated shapes extending in the X direction and elongated shapes extending in the Y direction on the surface of the interlayer dielectric film ILD1_2 in a planar view seen from the Z direction although not illustrated. That is, in the planar view seen from the Z direction, the insulating materials 103_2a are formed in the manner of islands (the manner of dots) on the surface of the interlayer dielectric film ILD1_2 and are arrayed two-dimensionally in a matrix in the X direction and the Y direction. Therefore, the insulating materials 103_2a serve as supporting posts on the inner side of the conductive material 102_2a in the CMP process and can reduce dishing of the conductive material 102_2a.

This enables the contact resistance between the conductive material 102_1a and the conductive material 102_2a to be low and stable.

The third embodiment may be combined with any one of the first embodiment, the second embodiment, the first modification, and the second modification. That is, the pads P1_1a according to the third embodiment may be bonded to the pads P1_2a according to any one of the first embodiment, the second embodiment, the first modification, and the second modification.

The third embodiment may be used for bonding between the memory chips 40_1 and 40_2. That is, the third embodiment may be applied to the pads P1_2b of the memory chip 40_1 and the pads P2_1b of the memory chip 40_2. Accordingly, dishing of the pads P1_2b and the pads P2_1b is suppressed and the bonding between the memory chips 40_1 and 40_2 can also be stabilized with a low resistance.

Fourth Embodiment

Figure 24:
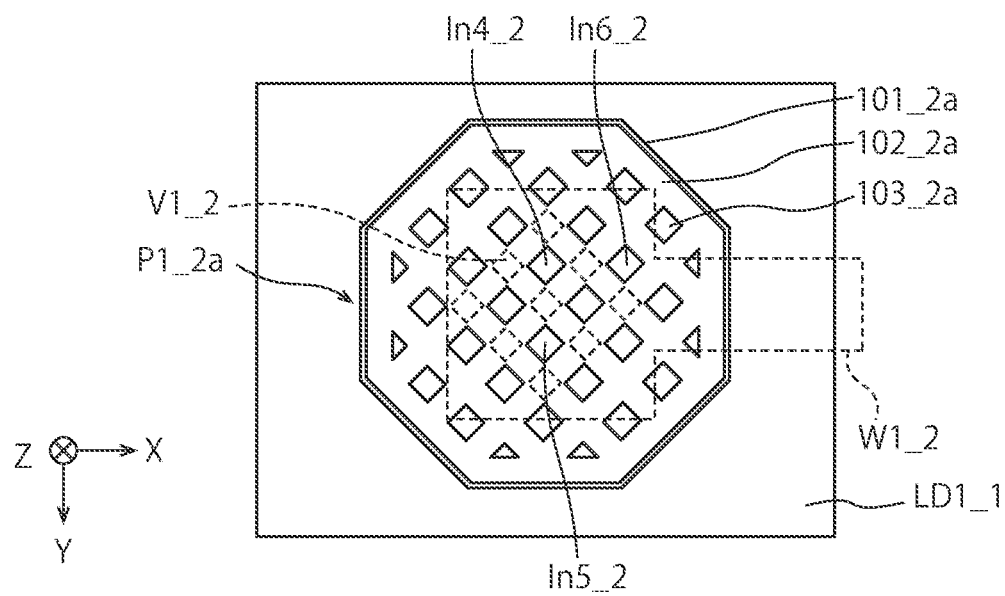
FIG. 24 is a plan view illustrating a configuration example of pads according to a fourth embodiment.

FIG. 24 is a plan view illustrating a configuration example of the pads P1_2a according to a fourth embodiment. In the fourth embodiment, the conductive material 102_2a of each of the pads P1_2a extends in a direction oblique to the X and Y directions in a planar view seen from the Z direction. The configurations of the pads P1_1a may be identical to those of any one of the first to third embodiments and the first and second modifications. The distance between dot-like insulating materials closest in the X direction and the Y direction in each of the pads P1_1a in the third embodiment is different from the distance between dot-like insulating materials closest in the X direction and Y direction when the conductive material 102_2a is oblique as in the fourth embodiment. For example, assuming one of the insulating materials 103_2a as a fourth insulating portion In4_2, an insulating portion arranged in the Y direction and closest to the fourth insulating portion In4_2 is a fifth insulating portion In5_2 and an insulating portion arranged in the X direction and closest to the fourth insulating portion In4_2 is a sixth insulating portion In6_2. The distance between the first insulating portion In1_1 and the second insulating portion In2_1 as seen in the Y direction is shorter than the distance between the fourth insulating portion In4_2 and the fifth insulating portion In5_2. The distance between the first insulating portion In1_1 and the third insulating portion In3_1 as seen in the X direction is shorter than the distance between the fourth insulating portion In4_2 and the sixth insulating portion In6_2.

In the fourth embodiment, the pads P1_1a and the associated pads P1_2a are respectively bonded to each other in such a manner that the extending direction of the conductive material 102_1a intersects with the extending direction of the conductive material 102_2a on the bonding surface B_mc1 when the array chip CH_A1 and the circuit chip CH_C1 are stuck to each other. Since the extending direction of the insulating materials 103_1a intersects with the extending direction of the insulating materials 103_2a, the contact area between the conductive material 102_1a and the conductive material 102_2a does not change so much even if the pads P1_1a are displaced to some extent in the X or Y direction from the pads P1_2a. Therefore, the fourth embodiment can stabilize the contact resistance against the displacement of the pads P1_1a from the pads P1_2a on the bonding surface B_mc1.

Other configurations of the fourth embodiment may be identical to the corresponding ones of the first to third embodiments. Accordingly, the fourth embodiment can also achieve the effects of any one of the first to third embodiments.

Fifth Embodiment

Figure 25:
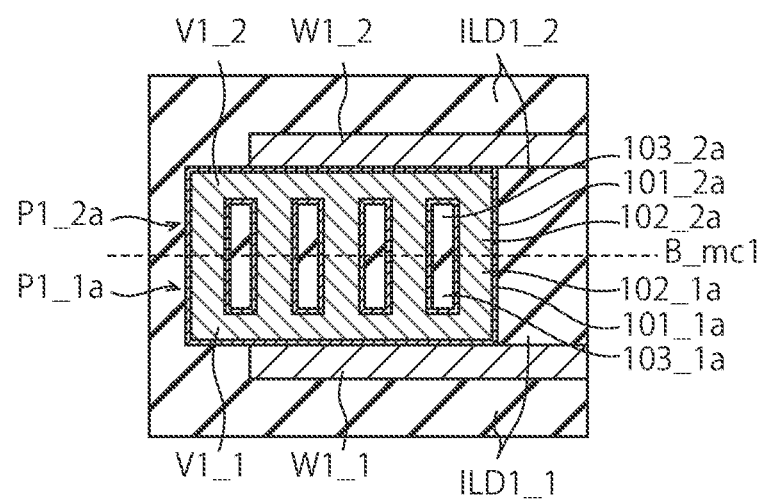
FIG. 25 is a sectional view illustrating a configuration example of a region of a bonding surface according to a fifth embodiment.

FIG. 25 is a sectional view illustrating a configuration example of the region of the bonding surface B_mc1 according to a fifth embodiment. The pads P1_1a and P1_2a formed according to the second modification described above are used in the fifth embodiment.

In the fifth embodiment, the via contacts V1_1 are provided below each of the pads P1_1a and are electrically connected in common to the conductive material 102_1a. The via contacts V1_1 electrically connect the conductive material 102_1a to the wiring layer W1_1. In this way, the via contacts V1_1 are provided to be integral with the conductive material 102_1a in the entire formation region of each of the pads P1_1a.

Accordingly, the conductive material 102_1a of the pads P1_1a is slightly raised from the bonding surface B_mc1 due to volume expansion (heat expansion) of the via contacts V1_1 and the conductive material 102_1a.

Also for the pads P1_2a, the via contacts V1_2 are similarly provided below each of the pads P1_2 and are electrically connected in common to the conductive material 102_2a. The via contacts V1_2 electrically connect the conductive material 102_2a to the wiring layer W1_2. In this way, the via contacts V1_2 are also provided in the entire formation region of each of the pads P1_2a to be integral with the conductive material 102_2a. Accordingly, the conductive material 102_2a of each of the pads P1_2a is slightly raised from the bonding surface B_mc1 due to volume expansion (heat expansion) of the via contacts V1_2 and the conductive material 102_2a.

With raising of the pads P1_1a and P1_2a from the bonding surface B_mc1, the pads P1_1a and P1_2a are respectively reliably bonded to each other on the bonding surface B_mc1. Therefore, the pads P1_1a and P1_2a can be connected to each other stably with a low resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate having a first semiconductor circuit provided thereon;
first pads located on the substrate;
second pads respectively bonded to the first pads;
a first insulating layer located outside of each of the first pads on a bonding surface of the first pads and the second pads; and
a second insulating layer located outside of each of the second pads on the bonding surface and bonded to the first insulating layer, wherein
the first pads each comprise a first area including a first conductor and a second area including a third insulating layer on the bonding surface, the second area is located inside of the first area on the bonding surface,
the first semiconductor circuit comprises one of a memory cell array and a CMOS circuit configured to control the memory cell array, and
the device further comprises a second semiconductor circuit comprising the other of the memory cell array and the CMOS circuit configured to control the memory cell array on an opposite side to the first semiconductor circuit with the bonding surface interposed between the first semiconductor circuit and the second semiconductor circuit.

2. The device of claim 1, wherein the second area comprises a first extending portion extending in a first direction on the bonding surface.

3. The device of claim 1, wherein the second area is smaller than the first area on the bonding surface.

4. The device of claim 1, wherein the second pads each comprise a third area including a second conductor and a fourth area including a fourth insulating layer on the bonding surface, the fourth area is located inside of the third area on the bonding surface.

5. The device of claim 4, wherein the fourth area comprises a second extending portion extending in a second direction lying in an in-plane direction of the bonding surface and different from the first direction on the bonding surface.

6. The device of claim 1, wherein
on the bonding surface,
the third insulating layer comprises
a first insulating portion,
a second insulating portion arranged alongside of the first insulating portion in the first direction and being closest thereto, and
a third insulating portion arranged alongside of the first insulating portion in a second direction lying in an in-plane direction of the bonding surface and perpendicular to the first direction, and being closest thereto.

7. The device of claim 6, wherein
on the bonding surface,
the fourth insulating layer comprises
a fourth insulating portion,
a fifth insulating portion arranged alongside of the fourth insulating portion in the first direction and closest thereto, and
a sixth insulating portion arranged alongside of the fourth insulating portion in the second direction and closest thereto, and
when a distance between the first insulating portion and the second insulating portion closest in the first direction is a first distance, and
a distance between the fourth insulating portion and the fifth insulation portion closest in the first direction is a second distance,
the first distance is different from the second distance.

8. The device of claim 1, wherein the first insulating layer and the third insulating layer are simultaneously formed.

9. The device of claim 1, wherein
the first insulating layer and the first insulator comprise oxygen and silicon, and
the third insulating layer comprises copper, gold, or copper and gold.

10. A semiconductor device comprising:
a substrate having a first semiconductor circuit provided thereon;
first pads located on the substrate;
second pads respectively bonded to the first pads;
a first insulating layer located outside of each of the first pads on a bonding surface of the first pads and the second pads; and
a second insulating layer located outside of each of the second pads on the bonding surface and bonded to the first insulating layer, wherein
the first pads each comprise a first area including a first conductor and a second area including a third insulating layer on the bonding surface, the second area is located inside of the first area on the bonding surface,
the first semiconductor circuit comprises a first memory cell array and a first CMOS circuit configured to control the first memory cell array, and
the device further comprises a second semiconductor circuit comprising a second memory cell array and a second CMOS circuit configured to control the second memory cell array on an opposite side to the first semiconductor circuit with the bonding surface interposed between the first semiconductor circuit and the second semiconductor circuit.

11. The device of claim 10, wherein the second area comprises a first extending portion extending in a first direction on the bonding surface.

12. The device of claim 10, wherein the second area is smaller than the first area on the bonding surface.

13. The device of claim 10, wherein the second pads each comprise a third area including a second conductor and a fourth area including a fourth insulating layer on the bonding surface, the fourth area is located inside of the third area on the bonding surface.

14. The device of claim 13, wherein the fourth area comprises a second extending portion extending in a second direction lying in an in-plane direction of the bonding surface and different from the first direction on the bonding surface.

15. The device of claim 10, wherein
on the bonding surface,
the third insulating layer comprises
a first insulating portion,
a second insulating portion arranged alongside of the first insulating portion in the first direction and being closest thereto, and
a third insulating portion arranged alongside of the first insulating portion in a second direction lying in an in-plane direction of the bonding surface and perpendicular to the first direction, and being closest thereto.

16. The device of claim 15, wherein
on the bonding surface,
the fourth insulating layer comprises
a fourth insulating portion,
a fifth insulating portion arranged alongside of the fourth insulating portion in the first direction and closest thereto, and
a sixth insulating portion arranged alongside of the fourth insulating portion in the second direction and closest thereto, and
when a distance between the first insulating portion and the second insulating portion closest in the first direction is a first distance, and
a distance between the fourth insulating portion and the fifth insulation portion closest in the first direction is a second distance,
the first distance is different from the second distance.

17. The device of claim 10, wherein the first insulating layer and the third insulating layer are simultaneously formed.

18. The device of claim 10, wherein
the first insulating layer and the third insulating layer comprise oxygen and silicon, and
the first conductor comprises copper, gold, or copper and gold.

* * * * *